US008762629B2

(12) United States Patent
Radke et al.

(10) Patent No.: US 8,762,629 B2
(45) **Date of Patent: *Jun. 24, 2014**

(54) DATA CONDITIONING TO IMPROVE FLASH MEMORY RELIABILITY

(75) Inventors: William H. Radke, Los Gatos, CA (US); Vishal Sarin, Cupertino, CA (US); Jung-Sheng Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/616,486

(22) Filed: Sep. 14, 2012

(65) Prior Publication Data

US 2013/0007355 A1 Jan. 3, 2013

Related U.S. Application Data

(63) Continuation of application No. 12/059,831, filed on Mar. 31, 2008, now Pat. No. 8,281,061.

(51) Int. Cl.
*G06F 13/00* (2006.01)
*G06F 13/28* (2006.01)

(52) U.S. Cl.
USPC .................. 711/103; 711/165; 711/E12.008; 714/701

(58) Field of Classification Search
USPC .............. 711/103, 165, E12.008; 714/5, 701
See application file for complete search history.

(56) References Cited

U.S. PATENT DOCUMENTS

| | | | | |
|---|---|---|---|---|
| 5,930,167 | A * | 7/1999 | Lee et al. | 365/185.03 |
| 8,281,061 | B2 * | 10/2012 | Radke et al. | 711/103 |
| 2003/0018861 | A1 | 1/2003 | Micheloni et al. | |
| 2008/0109703 | A1 | 5/2008 | Brandman | |
| 2008/0215798 | A1 * | 9/2008 | Sharon et al. | 711/103 |
| 2008/0215800 | A1 | 9/2008 | Lee et al. | |
| 2008/0301532 | A1 * | 12/2008 | Uchikawa et al. | 714/773 |
| 2008/0316815 | A1 * | 12/2008 | Lin | 365/185.03 |
| 2009/0113115 | A1 | 4/2009 | Nazarian et al. | |
| 2009/0129146 | A1 | 5/2009 | Sarin et al. | |
| 2009/0150596 | A1 | 6/2009 | Cheng | |
| 2009/0300269 | A1 | 12/2009 | Radke et al. | |
| 2010/0122147 | A1 * | 5/2010 | Kanno et al. | 714/763 |

* cited by examiner

*Primary Examiner* — Edward Dudek, Jr.
(74) *Attorney, Agent, or Firm* — Dicke, Billig & Czaja, PLLC

(57) ABSTRACT

Methods and apparatus for managing data storage in memory devices utilizing memory arrays of varying density memory cells. Data can be initially stored in lower density memory. Data can be further read, compacted, conditioned and written to higher density memory as background operations. Methods of data conditioning to improve data reliability during storage to higher density memory and methods for managing data across multiple memory arrays are also disclosed.

17 Claims, 7 Drawing Sheets

400
SLC: (PGMD) 0x0, 4, 8, ...
SLC: (PGMD) 0x1, 5, 9, ...
SLC: (PGMD) 0x2, 6, A, ...
SLC: (PGMD) 0x3, 7, B, ...
CONTROLLER
MLC: (FREE)
MLC: (FREE)
402
404
406
408
414
410
412
416
418
DATA HANDLING
420
DATA COMPACTION
422
DATA CONDITIONING
424
426
MLC: (PGMD) 0,1,2,3,4,5,6,7,8,9,A,...
428
430
432
SLC: (FREE)
434
436
438
440

DATA CONDITIONING TO IMPROVE FLASH MEMORY RELIABILITY

RELATED APPLICATIONS

This application is a continuation of U.S. patent application Ser. No. 12/059,831, entitled, "DATA CONDITIONING TO IMPROVE FLASH MEMORY RELIABILITY," filed on Mar. 31, 2008 and issued as U.S. Pat. No. 8,281,061 on Oct. 2, 2012, which application is commonly assigned and incorporated in its entirety herein.

TECHNICAL FIELD

The present disclosure relates generally to memory devices and in particular the present disclosure relates to managing data stored in a memory device having single and multi level memory cell storage capability.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data, such as a basic input/output system (BIOS), are typically stored in flash memory devices for use in personal computer systems.

Flash memory typically utilizes one of two basic architectures known as NOR Flash and NAND Flash. The designation is derived from the logic used to read the devices. In a NAND type flash memory array architecture, the floating gate memory cells of the memory array are arranged in an array of rows and columns. The memory cells of the array are also arranged together in strings, typically of 8, 16, 32, or more each, where the memory cells in the string are connected together in series, source to drain, between a common source line and a column transfer line, often referred to as a bit line. The array is then accessed by a row decoder activating a row of floating gate memory cells by selecting the signal line (often referred to as a word line) connected to their gates. In addition, bit lines can also be driven high or low depending on the current operation being performed.

As the performance and complexity of electronic systems increase, the requirement for additional memory in a system also increases. However, in order to continue to reduce the costs of the system, it is desirable to keep the parts count low. This can be accomplished by increasing the memory density of an integrated circuit by using such technologies as multilevel cells (MLC). For example, MLC NAND flash memory is a cost effective non-volatile memory.

Multilevel memory cells assign a data state (e.g., as represented by a bit pattern) to a specific range of threshold voltages (Vt) stored in the memory cell. Single level memory cells (SLC) permit the storage of a single bit of data in each memory cell. Meanwhile, MLC technology permits the storage of two or more binary digits (e.g., bits) per cell (e.g., 2, 4, 8, 16 bits), depending on the quantity of threshold voltage ranges assigned to the cell and the stability of the assigned threshold voltage ranges during the lifetime operation of the memory cell. The number of threshold voltage ranges (e.g., levels), which are sometimes referred to as Vt distribution windows, used to represent a bit pattern comprised of N-bits is $2^N$. For example, one bit may be represented by two levels, two bits by four levels, three bits by eight levels, etc. Memory cells adapted to store more than two bits per cell are sometimes referred to as Hyper-MLC memory cells.

For example, a cell may be assigned a Vt that falls within one of four different voltage ranges of 200 mV, each being used to represent a data state corresponding to a bit pattern comprised of two bits. Typically, a dead space (which is sometimes referred to as a margin) of 0.2V to 0.4V is maintained between each range to keep the ranges from overlapping and allows for control circuitry of a memory device to discriminate between data states in a memory cell. As one example, if the voltage stored in the cell is within the first of the four Vt ranges, the cell in this case is storing a logical '11' state and is typically considered the erased state of the cell. If the voltage is within the second of the four Vt ranges, the cell in this case is storing a logical '10' state. A voltage in the third range of the four Vt ranges would indicate that the cell in this case is storing a logical '00' state. Finally, a Vt residing in the fourth Vt range indicates that a logical '01' state is stored in the cell.

A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc. An MLC (four level) memory cell is typically referred to as a lower density memory cell than an MLC (eight level) memory due to the lower number of bits stored per memory cell, for example. SLC (e.g., MLC (two level)) is typically referred to as a lower density memory than MLC (four level) memory and so on.

There are advantages and disadvantages associated with using SLC or MLC memory. MLC memory is generally considered more cost effective in regards to memory density as MLC memory can, for example, store multiple bits of data in a single memory cell as opposed to SLC memory which is conventionally used to store one bit of data per cell. However, conventional SLC memory can be written to many (e.g., by an order magnitude) more times than conventional MLC memory. For example, a characteristic of conventional MLC memory is that after data has been erased and re-written about 10,000 times the memory may become subject to significant read and write errors. Conventional SLC memory on the other hand typically may be erased and re-written about 100,000 times before the reliability of the data begins to deteriorate. These density and performance characteristics also apply between different types of MLC arrays. While an MLC with more levels (higher density) would be more efficient than an MLC with less levels (lower density), these higher density devices may have performance penalties over the lower density devices as they are operating with increasingly smaller Vt ranges and smaller margins. Another example of a performance characteristic of different density memory devices (e.g., SLC, MLC) is that lower density memory can typically be written to faster than higher density memory. Thus, if data is to be written to higher density memory, additional time will generally be required to complete a write operation to the higher density memory than to lower density memory.

For the reasons stated above, and for other reasons stated below which will become apparent to those skilled in the art upon reading and understanding the present specification, there is a need in the art for memory devices that are adapted to manage the utilization of memory of different densities, such as SLC and MLC memory, to take advantage of preferred operating characteristics associated with each type of memory.

DETAILED DESCRIPTION

Figure 1:
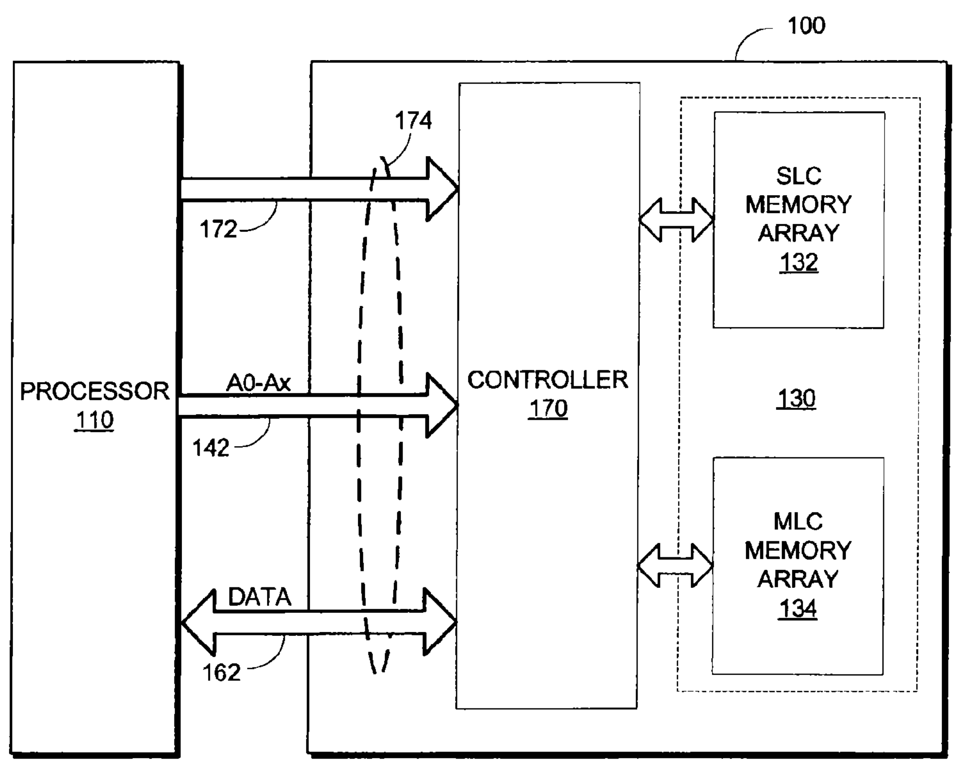
FIG. 1 is a functional block diagram of a memory module according to an embodiment of the present disclosure.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present disclosure is defined only by the appended claims, along with the full scope of equivalents to which such claims are entitled.

As discussed above, conventional SLC and MLC memory have both positive and negative attributes associated with them. Lower density memory generally allows for faster write operations and can generally withstand far more write operations before reliability of the memory cells begin to degrade as compared to higher density memory. However, lower density memory generally is not as efficient as higher density memory in that higher density memory can store more bits of data in each memory cell. Various embodiments of the present disclosure store data first to a lower density (e.g., SLC) array of memory in a memory device having more than one array of different density memory arrays. This can be used to enhance the efficiency and reliability of memory devices. For example, the data can be initially written to the lower (e.g., faster) density memory. Various data handling (e.g., data conditioning) operations can then be performed on the data stored in the lower density memory and ultimately the conditioned data is then moved to the higher density memory. The data handling operations and storage in the higher density memory can all be performed as part of a background operation. This relieves the host or other external device from the burden of waiting for data to be written to the slower, higher density memory. Embodiments of the present disclosure thus allow a host to store data quickly and further allows for additional data handling to be performed that improves the reliability of data stored in the slower but higher density memory.

For convenience, the embodiments will be described with reference to utilizing SLC and MLC memory as the memories of differing densities. However, the various embodiments are not so limited and it will be apparent that the concepts described with reference to SLC and MLC memory may be extended to other combinations of memory densities. In general, the embodiments include a memory having a first density and at least one memory having a density greater than the first density. For example, one embodiment may utilize SLC memory, sometimes referred to as MLC (two level) memory, and MLC (four level) memory. Another embodiment may utilize MLC (four level) and MLC (eight level) memory. Still other embodiments can utilize three or more memory arrays such as SLC, MLC (four level) and MLC (eight level) memory in the same memory device, for example. Other combinations are possible according to the various embodiments of the present disclosure. Thus the embodiments can utilize a combination of different density memory in a memory device.

Data in a non-volatile memory device can be accessed through an abstraction called a logical block address (LBA) that does not define where the data physically resides in the device. The device can also have physical block addresses (PBA) that define a physical location, but does not define or imply what data is kept in this location. In a magnetic disk device, a physical block address translates to a specific cylinder, head, and sector. In a solid state non-volatile memory device, the physical block address typically refers to a specific memory block address in a specific memory array. Logical block addresses and physical block addresses are well known to those skilled in the art. Memory devices maintain look up tables which map LBAs to their assigned PBAs. Conventional memory devices that have both SLC and MLC memory store data in either SLC memory or MLC memory. The data does not move between the SLC and MLC memory. This is in contrast with various embodiments of the present disclosure which according to one or more embodiments cause data to be stored first in a lower density memory array of the memory device. Data stored in the lower density memory can then be handled (e.g., conditioned and/or compacted) and then stored in a higher density memory array of the memory device at a later time. After data has been moved out of the lower density memory, those memory locations in the lower density memory can be marked as available for use during a subsequent write operation.

FIG. 1 illustrates a memory device 100 according to an embodiment of the present disclosure. The memory device 100 in FIG. 1 has been simplified to focus on various embodiments of the present disclosure. The memory device 100 comprises a controller 170 for controlling and managing the operations of the memory device 100 according to various embodiments of the present disclosure. The controller 170 can take the form of discrete logic or a state machine, for example. The controller 170 also incorporates various means for communicating with a host, such as a processor 110. For example, the controller 170 may incorporate a Universal Serial Bus (USB), SATA, PATA, ATA8-ACS, SD, MMC, Compact Flash, Memory Stick, IEEE 1394 or BA-NAND interface as are well known in the art. Physical wear leveling of the SLC and MLC memory can also be handled by the controller 170.

The memory device 100 also comprises an array of SLC memory 132 and an array of MLC memory 134. In some embodiments, the SLC 132 and MLC 134 memory may be separate flash memory chips or discrete devices while in others the SLC and MLC memory may be contained on one chip 130. Additional embodiments can utilize more than just two arrays of memory as shown in FIG. 1. The memory arrays of memory device 100 may also be comprised of different density MLC memory. Array 132 might be MLC (four level) and array 134 might be MLC (eight level), for example. The SLC 132 and MLC 134 memory illustrated in FIG. 1 may each be further comprised of multiple banks and blocks of memory. Each of the SLC 132 and MLC 134 memory blocks shown in FIG. 1 can be further comprised of multiple memory chips. The amount (e.g. capacity) of SLC and MLC memory of the memory device 100 may or may not be equal. In some embodiments (e.g. a single chip comprising SLC and MLC memory) the size of the SLC array and MLC array may be assignable depending on the desired amount of SLC vs. MLC memory for a given application. In another embodiment according to the present disclosure, the memory device of FIG. 1 may be a two-way interleaved memory device having two SLC chips and two MLC chips. Other quantities of SLC and MLC chips are also possible according to various embodiments of the present disclosure.

FIG. 1 also illustrates the memory device 100 coupled to a processor 110. The memory device 100 is coupled to the processor 110 by way of an interface 174, which may comprise multiple busses and signals. For example, control signals generated by the processor can be coupled to the memory device by a control bus 172. Additionally, an address bus 142 and a data bus 162 are also shown in the figure. The interface 174 may conform to one of the interface protocols discussed above (e.g., USB, SATA, PATA, et al.).

The controller 170 is also adapted to facilitate the data handling operations according to the various embodiments of the present disclosure. For example, the controller can perform wear leveling operations in both the SLC 132 and the MLC 134 memory of memory device 100. Additional data handling operations performed by the controller 170 can comprise data compaction and conditioning operations. These data handling operations and others are discussed subsequently with respect to FIGS. 2-7.

Figure 2:
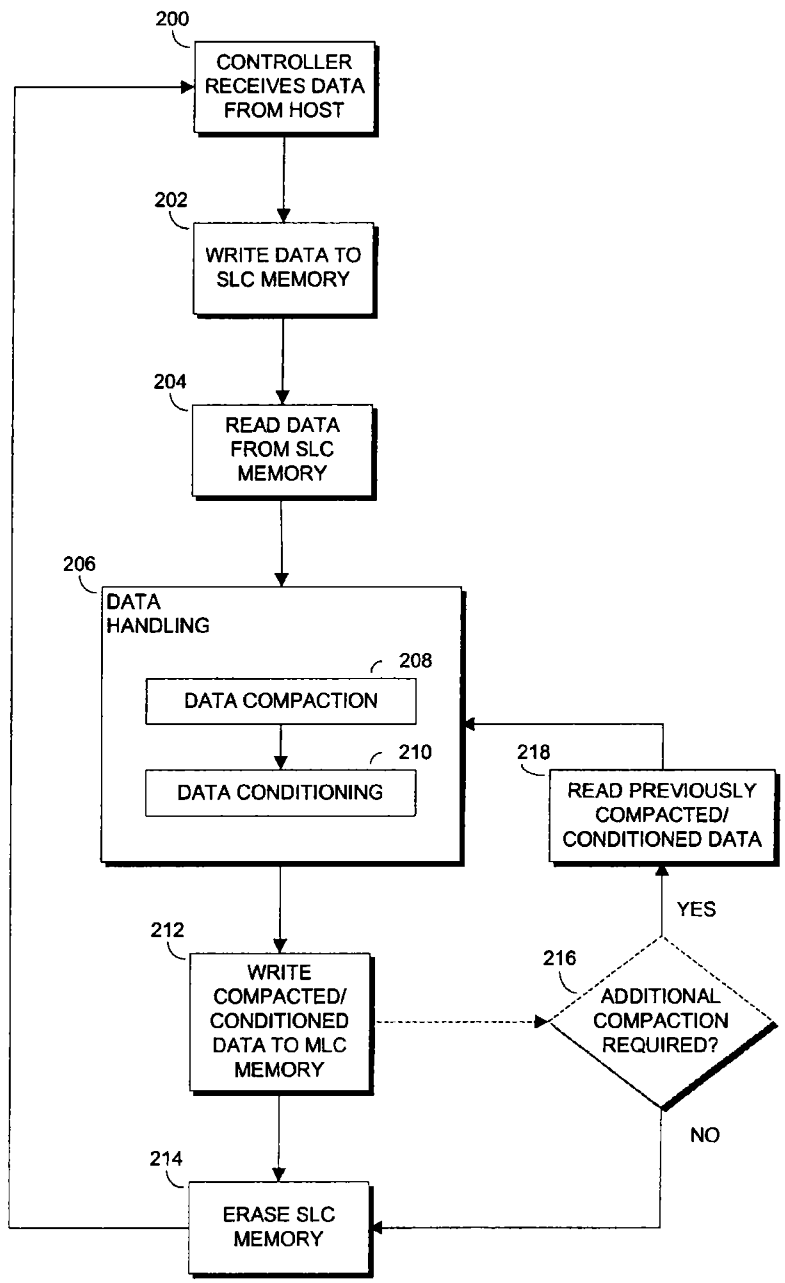
FIG. 2 is a flow chart illustrating multiple operations according to various embodiments of the present disclosure.

FIG. 2 is a flow chart illustrating a data handing and storage operation according to one or more embodiments of the present disclosure. A host, such as processor 110 of FIG. 1, supplies data to be stored that is then received 200 by the memory device controller 170. Controller 170 then facilitates a write operation 202 of the data to the lowest density (e.g., fastest) memory of the memory device available for write operations, such as the SLC memory 132 of memory device 100. After the write operation 202 to the SLC memory is complete, the host is relieved of further responsibility with regard to storing the data in the memory device 100. Thus, the additional operations illustrated in FIG. 2 can be performed as a background operations as far as the host 110 is concerned. Controller 170 then performs a read operation of data stored in the SLC memory 204. The controller 170 determines under what circumstances that the read operation 204 will take place. For example, the controller 170 may wait until a particular amount of SLC memory has been written to before performing the read operation 204. Other circumstances are discussed subsequently. After a particular amount of data from SLC has been read 204, the controller performs one or more of the various data handling operations 206 according to the various embodiments of the present disclosure.

The controller 170 will determine how data stored in SLC will be compacted 208 for storage in the MLC 134 (e.g., higher density) memory. As discussed above regarding SLC memory, one bit of data can be stored in an SLC memory cell. As MLC memory can store more than one bit of data per cell, the data stored in a plurality of SLC memory cells can be compacted (e.g., combined) and stored in a single MLC memory cell. For example, the data stored in two SLC memory cells can be combined and stored in one MLC (four-level) (e.g., 2 bit) memory cell. Data stored in four SLC memory cells can be combined and stored in an MLC (sixteen-level) (e.g., 4-bit) memory cell, etc.

The controller 170 can determine what amount of compaction is appropriate based on a number of factors. For example, if more reliability is desired, the controller 170 can perform a compaction of data wherein the data from two SLC memory cells is compacted 208 and stored 212 in one MLC memory cell. Data requiring less reliability may be more heavily compacted such as compacting data from four SLC memory cells to one MLC memory cell. The controller can also determine what level particular data is to be compacted to. For example, the controller may decide that the particular data is to be compacted to four (or more) bits per MLC memory cell. The controller may also determine that at the present time it would be too time consuming to perform a compaction and write operation of data directly to the final bit per cell level. Thus, according to one or more embodiments, the controller 170 can first perform a compaction and write operation of data to MLC (four-level) then further compact the data and write it to its final density at a later time as determined by the controller 170.

Data handling 206 as noted in FIG. 2 further comprises additional data conditioning operations that can also be facilitated by the controller 170. These optional data conditioning operations 210 can include methods to reduce back pattern effects and program disturbs. A detailed discussion of back pattern effect mitigation is included in U.S. patent application Ser. No. 11/943,729 ('729 application) filed Nov. 21, 2007 and titled, "Mitigation of Data Corruption From Back Pattern and Program Disturb in a Non-Volatile Memory Device," which is commonly assigned.

Additional data conditioning operations 210 can be performed on the data prior to writing it to MLC memory according to various embodiments. The data can be processed using a "pseudo-randomizing" function prior to writing the data to MLC. Thus, the data conditioning block 210 can represent a functional block in the controller 170 for performing a randomizing function to redistribute the data pattern among physical memory cells. The randomizing function helps to reduce back pattern effect described in the above referenced '729 application. A worst case scenario with regard to back pattern effect is a situation where all the memory cells of a string of cells are being programmed to their highest possible threshold voltage. By randomizing the data, this statistically reduces the likelihood of an entire string of memory cells needing to be programmed to their highest possible threshold level.

The randomization of data according to various embodiments can also assist in increasing cell current and reducing sensing errors. The worst case scenario for the occurrence of sensing errors due to low cell current is again when all the memory cells of a string of memory cells are being programmed to their highest possible threshold voltage. Again, by randomizing the data, this statistically reduces the likelihood of an entire string of memory cells needing to be programmed to their highest possible threshold level thereby increasing the cell current of a given string of memory cells. Because the function used to randomize the data is known, the inverse function can be applied to the data when it is read back from the array thereby recovering the original data.

Additional data conditioning operations 210 such as those to reduce floating gate coupling effects (sometimes referred to as program disturb effects) can be performed on the data prior to writing it to MLC memory. Floating gate coupling can occur when a first memory cell for example has been programmed to its final threshold voltage level. A subsequent programming operation performed on one or more memory cells near (e.g., adjacent) to the first memory cell can affect (e.g., disturb) the programming of the first memory cell. One method to address the disturb issue is to pre-compensate the data itself prior to writing it to the MLC memory. According to various embodiments, this pre-compensation may take place before the data is stored in the lower density (e.g., SLC) memory or after the data has been read from the lower density memory and prior to writing it to the higher density (e.g., MLC) memory. In such a method of pre-compensating the data, also described in the above referenced '729 application, the controller 170 according to one or more embodiments makes a determination based on the un-adjusted data to be written to MLC memory of the disturb effect which will occur during the write operation of the data to the MLC memory. Based on this determination, the controller adjusts (e.g., changes) values of the data to be written such that after the disturb effect has taken place during the programming operation, that the original intended data is present on the memory cells. To allow for increased granularity for programming of memory cells to the adjusted data value different from their un-adjusted data value, one or more binary digits could be added to the data.

Another data conditioning operation 210 utilized while writing 212 the data to the MLC memory is to utilize a course programming operation followed by fine programming operation. This course/fine programming method is also described in the above referenced '729 application and results in a reduction in disturb effects. In general, programming potentials are increased more rapidly during early stages of programming, and the rate of increase is reduced as the memory cells approach their desired threshold voltage.

Following the write operation 212 of compacted and/or conditioned data to the MLC (e.g., higher density) memory, the controller frees the SLC memory written to in operation 202 to support a future write operation to the memory device 100. The controller can facilitate an erase operation 214 of the SLC memory performed immediately following or otherwise subsequent to the MLC write operation 212. In alternate embodiments, the controller 170 can mark the cells to be erased and reused at a later time.

In an alternate embodiment according to various embodiments of the present disclosure, as discussed above, the controller 170 may perform a series (e.g., sequence) of data compaction operations instead of a single data compaction operation. For example, the controller 170 may determine that SLC data needs to be compacted and moved out of the SLC memory. However, the controller 170 may also determine that it cannot perform a full data compaction due to time constraints or loading of the controller 170, for example. For example, the controller 170 may delay a full data compaction or other data handling if it is too busy processing memory control signals, such as requests from the host, or if a read or write operation is currently being performed on one or more of the memories. In such a scenario where additional compaction is required 216, the controller 170 can perform an intermediate data compaction operation to move data from SLC to MLC (four-level) memory, for example. And at a later time as determined by the controller 170, perform a read operation 218 of the intermediate level compacted data and perform an additional compaction operation 206 on the data to compact it to its intended final compacted state (e.g., MLC (eight-level).) Other intermediate and final compaction levels are possible according to various embodiments of the present disclosure.

Figure 3:
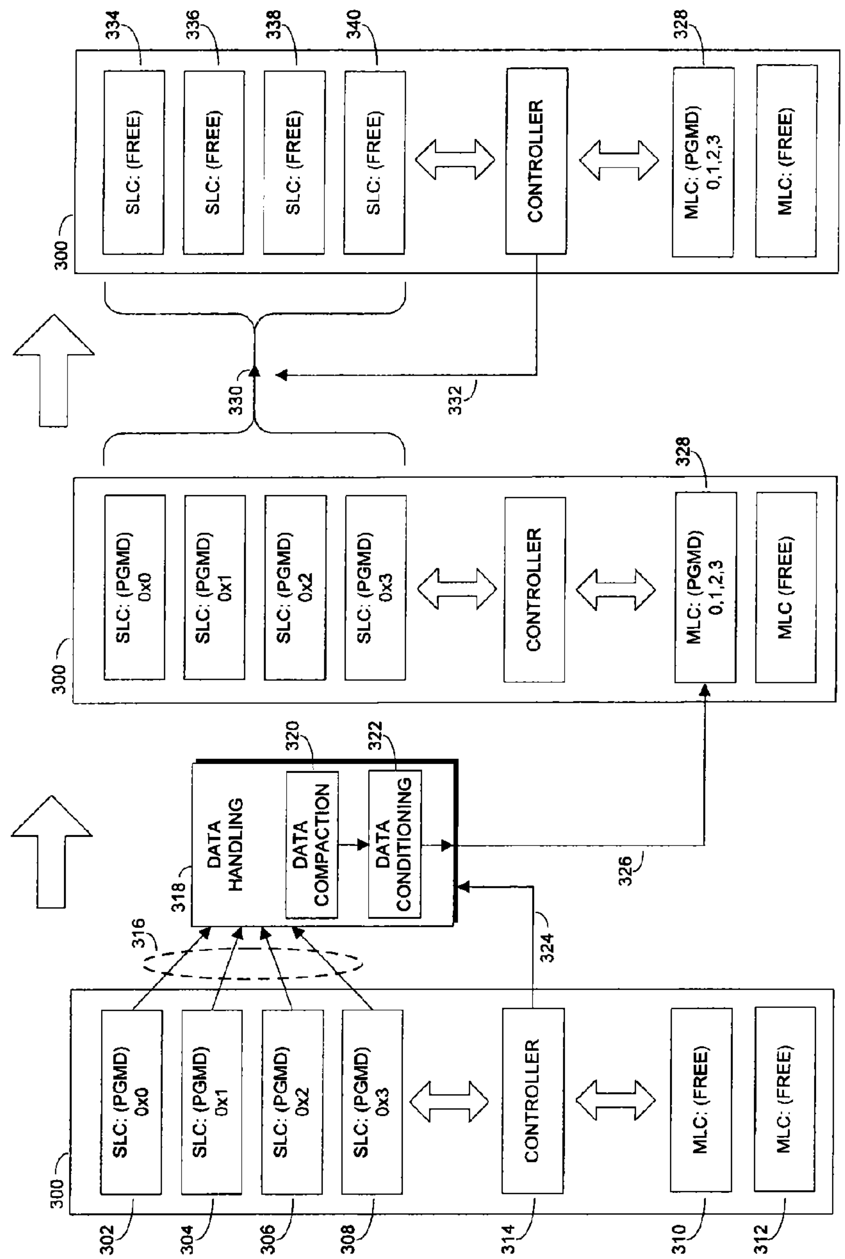
FIG. 3 illustrates a page based data handling operation utilizing a single memory device according to an embodiment of the present disclosure.

FIG. 3 illustrates a page based movement of data within a memory device 300 according to one or more embodiments of the present disclosure. Controller 314 of memory device 300 facilitates the various operations of the memory device 300 in a similar manner as discussed above with respect to controller 170 of FIG. 1. The memory device 300 illustrated is a single NAND memory device comprising both an array of SLC memory 302-308 and an array of MLC memory 310-312. However, the various embodiments are not so limited. As discussed above, a memory device such as 300 might be comprised of three or more arrays of varying density memory cells. The MLC memory 310-312 can also be written to in such a manner as allow for a various number of bits to be stored in the MLC memory cells. For example, the controller may determine that part or all of the MLC memory 310-312 may be programmed to data states representative of two bits per cell during one write operation. At a later time, the controller may perform a write operation to the same memory cells 310-312 such that four bits per cell are stored. MLC 310 and MLC 312 may also be two separate arrays that are adapted to store one number of bits per cell in array 310 and a greater number of bits per cell in array 312, for example.

The present example as illustrated by FIG. 3 shows four pages of SLC memory in the memory device 300. Each SLC page 302-308 is represented by its assigned address indicated by 0x0 through 0x3. Many more pages are possible according to the various embodiments. In the present example, each page of the SLC memory 302-308 has a capacity of 8 KB resulting in a total capacity of 32 KB of SLC memory in memory device 300. As noted, these capacities are just examples for convenience of description, and typical memory devices would have significantly greater capacities.

The four pages of SLC memory 302-308 of FIG. 3 have already been programmed such as through steps 200 and 202 as shown in FIG. 2. The presence of stored data is indicated by the 'PGMD' notation whereas unprogrammed memory is indicated by 'FREE' in the Figure. In the example operation as shown in FIG. 3, the controller defines the compaction operation to compact four pages of SLC data to one page of MLC data according to various embodiments of the present disclosure. Different embodiments can define the compaction operation to compact two pages of SLC data (e.g., 302,304) to one page of MLC 328 data. Still other embodiments may have differing compaction levels. Controller 314, based on criteria such as desired reliability, desired speed, etc., might define the compaction operation to compact five pages of SLC data to two pages of MLC data, for example. Again referring to the four SLC pages to one MLC page compaction example as illustrated in FIG. 3, the controller 314 performs a read operation 316 of the four pages of SLC data stored in SLC memory 302-308. Once the four pages of SLC data have been read 316 from the SLC memory, the controller 314 directs 324 the various data handling operations 318/206 according to one or more embodiments of the present disclosure discussed with respect to FIG. 2.

The data handling operations 318 according to one or more embodiments comprise a data compaction operation 320 of the four pages of data read from SLC memory 302-308 and one or more data conditioning operations performed on compacted data. The data compaction operation 320 comprises compacting the four 8 KB pages of SLC data such that the 32 KB of data can be written to one page of the MLC (sixteen-level) (e.g., 4-bit) memory 310. Following the compaction operation 320, further data conditioning 322 can be performed on the compacted data prior to writing 326 the compacted data to the MLC memory 328. These data conditioning operations 322/210, as discussed with respect to FIG. 2 above, can provide for added reliability of the data being stored in the MLC memory.

Upon completion of the data handling operations 318, the controller 314 facilitates 324 the write operation 326 to write the compacted and conditioned data to MLC memory 328. During the write operation 326, additional methods can be employed such as utilizing the course/fine programming scheme discussed above with respect to FIG. 2, for example. After the write operation 326 to the MLC memory 328 is complete, the SLC memory locations 302-308 are free for later use during a subsequent write operation. The controller 314 may choose to facilitate 332 an erase operation 330 of the SLC memory locations 302-308 immediately following the completed MLC write operation 326 or the controller may mark the SLC memory locations 334-340 as free for erasure and use during a write operation 202 sometime in the future. As discussed above, the data compaction and conditioning operations can be performed as background operations which do not require involvement of a host utilizing the memory device.

Figure 4:
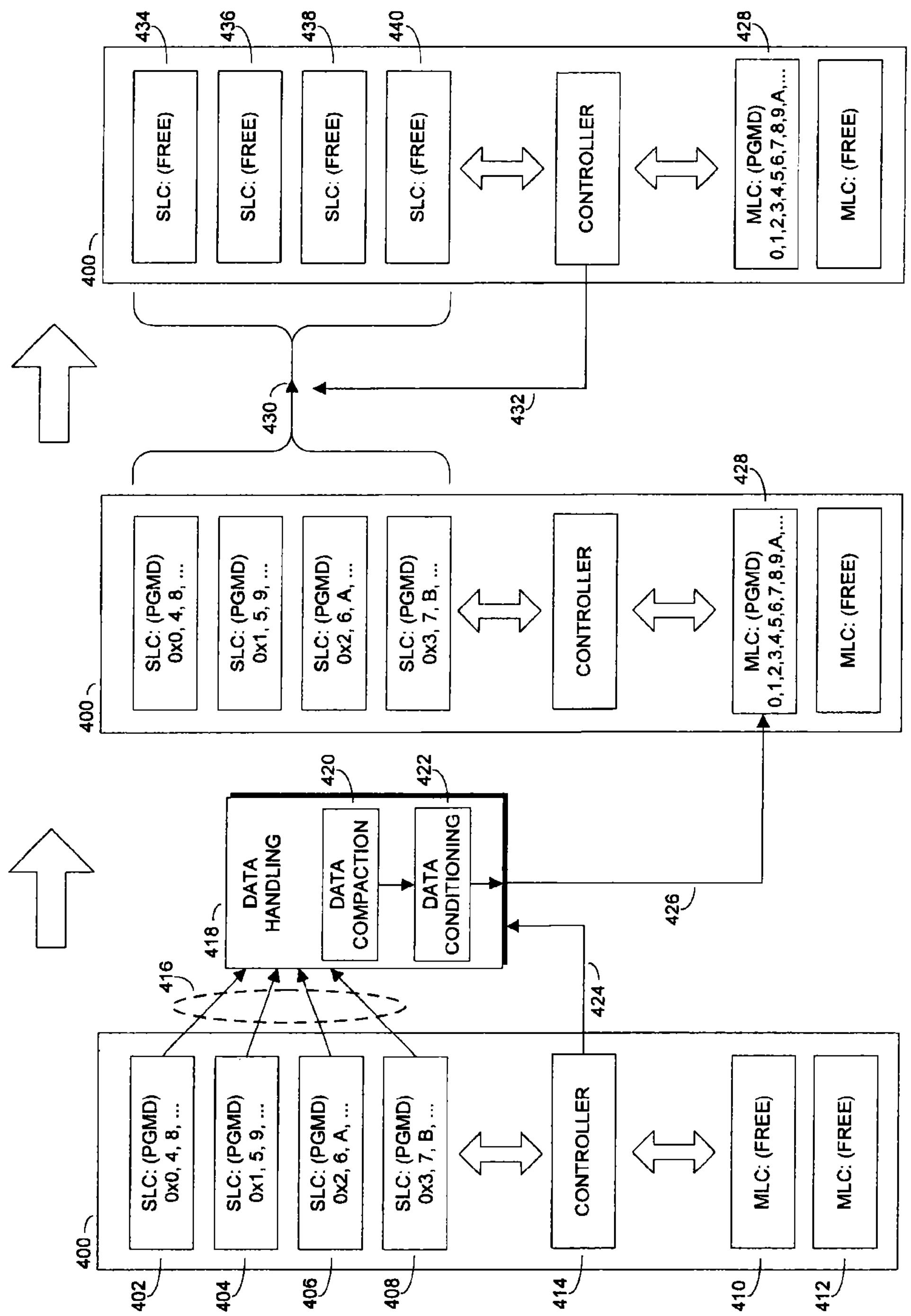
FIG. 4 illustrates a block based data handling operation utilizing a single memory device according to an embodiment of the present disclosure.

FIG. 4 illustrates a block based movement of data within a memory device 400 according to one or more embodiments of the present disclosure. Controller 414 of memory device 400 facilitates the various operations of the memory device 400 in a similar manner as discussed above with respect to controller 170 of FIG. 1 and controller 314 of FIG. 3. The memory device 400 illustrated is a single NAND memory device comprising both an array of SLC memory 402-408 and an array of MLC memory 410-412. The SLC memory 402-408 is shown as previously having been programmed (PGMD) such as through steps 200 and 202 as described with respect to FIG. 2. The example illustrated in FIG. 4 is one of compacting four blocks of SLC data 402-408 into one block of MLC 428 data. In the present example, 1 MB of data has been written into the four blocks of SLC memory 402-408, for example. Thus, after the data handling operation illustrated in FIG. 4 has completed according to various embodiments of the present disclosure, the 1 MB of data previously consuming four blocks of SLC memory 402-408 only consumes 1 block of MLC memory 428. Again, these capacities are just examples for convenience of description, and typical memory devices would have significantly greater capacities.

Again referring to FIG. 4, the controller 414 facilitates a read operation 416 of the four blocks of SLC memory 402-408 of memory device 400. Following the read operation 416, a data compaction operation 420 is performed on the data to compact the data to a level prescribed by the controller 414. For instance, compacting four blocks to one block according to the example illustrated by FIG. 4. At the individual memory cell level this results in a single bit of data from four SLC memory cells being stored in one MLC (4 bit) memory cell, for example. Other compaction ratios are possible according to various embodiments of the present disclosure such as two SLC blocks to one MLC block, for example.

Following the data compaction operation 420, additional data conditioning 422 according to various embodiments of the present disclosure can be performed on the compacted data. However, the various embodiments are not limited to data compaction followed by data conditioning operations. Data conditioning operations may be performed prior to data compaction operations, for example. These data conditioning methods might consist of various block based coding schemes and methods. For example, various block level coding schemes, block level ECC, data randomization, back pattern effect mitigation, data pre-compensation and course/fine programming methods during the write operation to MLC memory can be utilized. Additional coding techniques may also be utilized such as Trellis Code Modulation, Low-Density Parity Check (LDPC), Turbo codes, Reed Solomon and Bose-Chaudry-Hocquehen (BCH) among others, for example. Trellis Code Modulation might store 32 distinct levels in the same voltage range for 16 pieces of user data, for example. Thus one or more binary digits could be added to the user data to correspond to the coding information.

The compacted and conditioned data is then stored in MLC memory 428 by a write operation 426 facilitated 424 by the controller 414. At this point, the 1 MB of data consuming four blocks of SLC memory 402-408 has been compacted to consume only one block of MLC memory 428. The data conditioning operations 422 have further facilitated an improvement in the reliability of the data now stored in the MLC memory 428. Following the completion of the writing of data to the MLC memory, the previously programmed SLC memory 402-408 can be erased 430 under the direction 432 of the controller 414 and marked as SLC memory 434-440 that is free for use in future write operations 202. Again, it should be noted that the one or more embodiments facilitate the data management operations described to be performed as background operations so as not to hinder a host, such as a processor, coupled to the memory device. This facilitates improvements in both the performance and reliability of a memory device according to one or more embodiments of the present disclosure.

Figure 5:
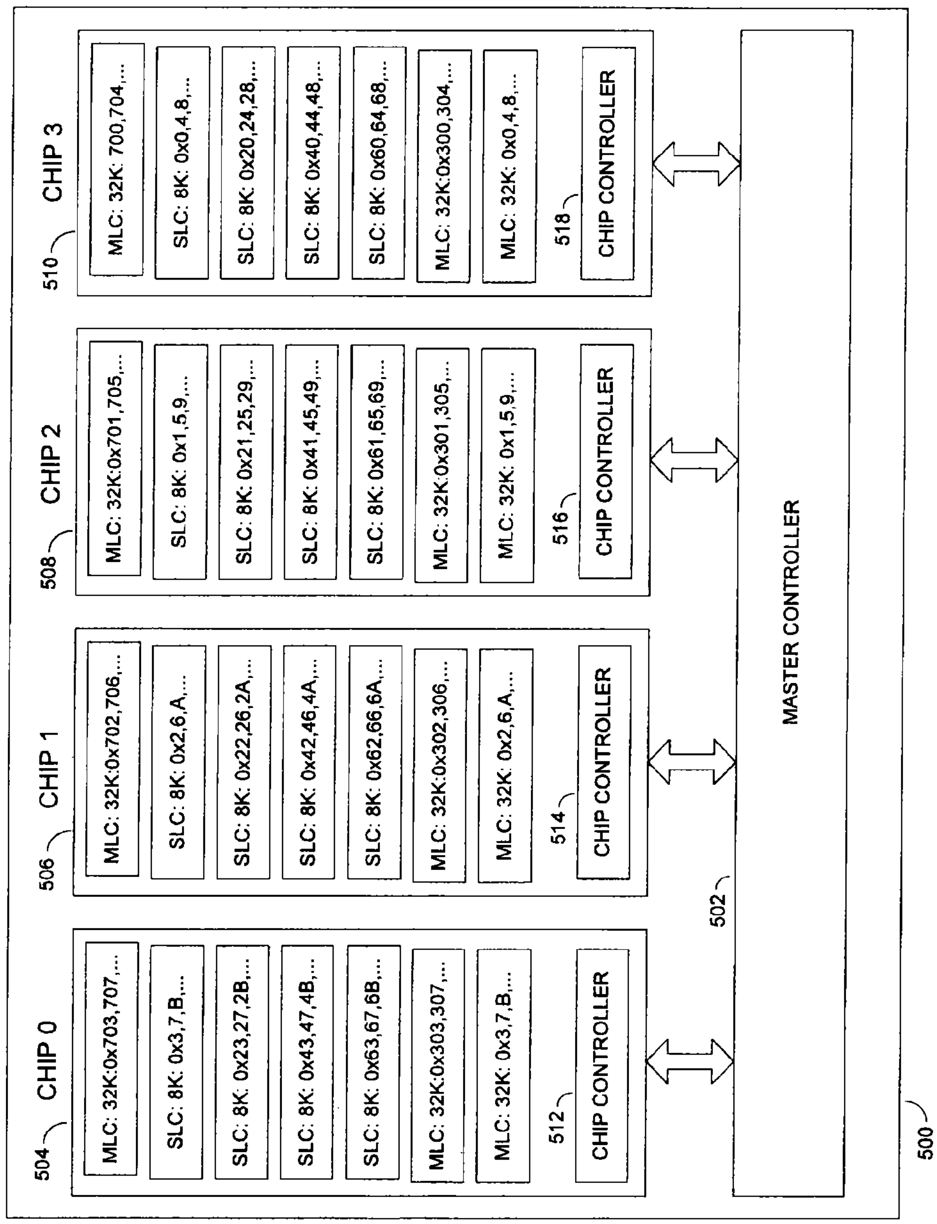
FIG. 5 is a diagram illustrating a multichip configuration of memory devices according to one or more embodiments of the present disclosure.
Figure 6:
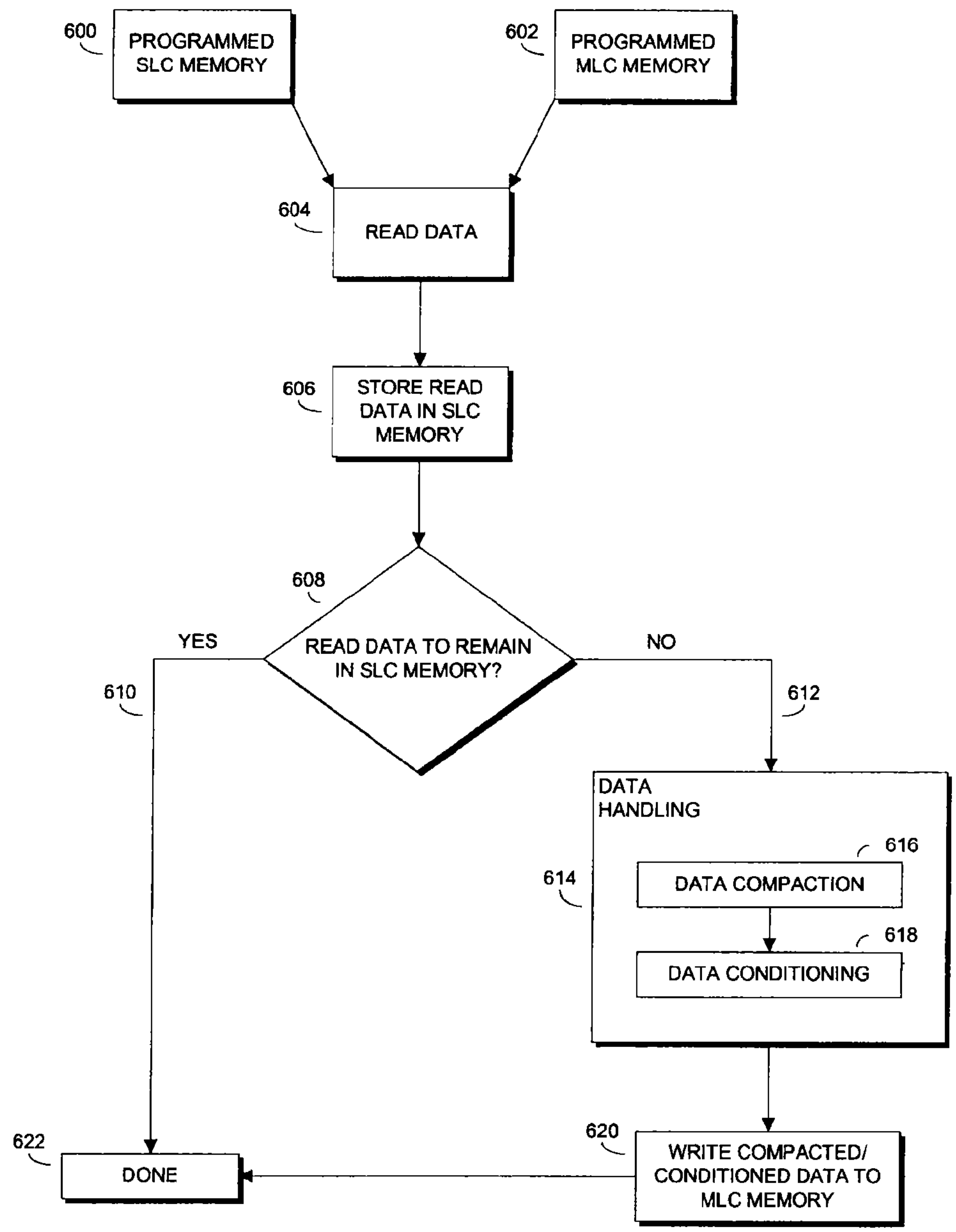
FIG. 6 is a flow chart illustrating an additional data handling operation according to one or more embodiments of the present disclosure.

The methods according to one or more embodiments of the present disclosure also provide for data management and handling of data previously stored through operations such as those described above with respect to FIGS. 1-4. A memory device 500 utilizing multiple memory chips 504-510 (e.g., multiple NAND memory devices 300,400) and a master controller 502 is illustrated in FIG. 5. FIG. 5 shows that each chip can comprise memory of differing densities (e.g., SLC, MLC) wherein each chip may additionally have its own controller 512-518. The controllers of each chip 512-518 may be adapted to perform various embodiments of the present disclosure such as those discussed above with respect to FIGS. 3 and 4. According to other embodiments the master controller 502 may implement the various methods according to one or more embodiments of the present disclosure.

As both SLC and MLC memory of the memory chips 504-510 is utilized, the master controller 502 can determine if data management (e.g., housekeeping) operations should be employed. For example, one or more chips may begin to fill faster than others or multiple copies of data may exist in the memory chips, for example. Therefore, the master controller 502 is adapted to move data not only from SLC memory to MLC memory but also from MLC to SLC and MLC to MLC memory, for example. Such data move operations are illustrated by way of reference to FIG. 6.

A situation may arise wherein all of the SLC memory of CHIP0 504 has become full. The master controller 502 can facilitate a read operation 604 of the programmed SLC memory 504/600. The read data 604 is then stored in a different location of SLC memory 606 such as in CHIP1 506, for example. The master controller 502 or the individual controller 514 of CHIP1, can then determine 608 if the data residing in the SLC memory of CHIP1 506 is to remain in SLC memory or if it should be moved to MLC memory according one or more embodiments of the present disclosure. For example, the master controller 502 (or chip controller 514) might determine 610 that the data read during operation 604 is to remain in SLC memory of CHIP1 506 and not be moved to MLC memory. This determination may occur in a situation where the particular pages of SLC memory are frequently utilized (e.g., busy pages.) The master controller 502 or the chip controller 514 may also determine 612 that the data is to be moved to MLC memory. In such a circumstance, the master 502 or chip 514 controller, can then facilitate data handling operations 614, including compaction 616 and optional conditioning 618, such as described above with respect to FIGS. 1-4. The compacted and conditioned data is then written 620 to the MLC memory locations as directed by the controller (e.g., master 502 or chip 514 controller.) These operations illustrated by reference to FIG. 6 can also be utilized to combine multiple copies of data residing in the memory device 100 and to perform wear leveling operations throughout the memory device 500, for example. Thus, the SLC memory can serve as a data cache in utilizing various embodiments of the present disclosure. Additional embodiments might move data from MLC memory having a higher density to MLC memory having a lower density. According to one or more embodiments, data previously stored in MLC (eight level) memory can be expanded and/or conditioned before being stored in MLC (four level) memory in order to improve reliability of the data, for example. Other levels of data expansion (e.g., MLC to SLC) are possible according to the various embodiments of the present disclosure.

Figure 7:
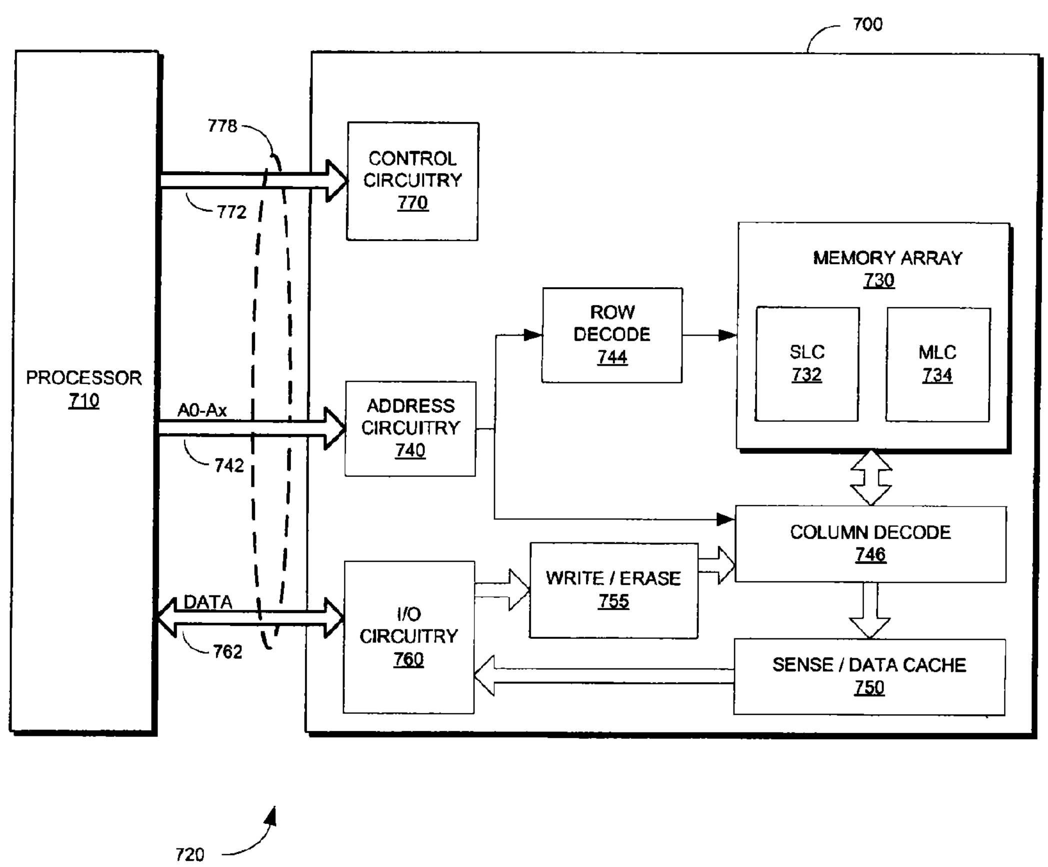
FIG. 7 is a functional block diagram of a memory system according to one or more embodiments of the present disclosure.

FIG. 7 is a functional block diagram of an electronic system having at least one memory device according to one or more embodiments of the present disclosure. The memory device 700 illustrated in FIG. 7 is coupled to a processor 710. The processor 710 may be a microprocessor or some other type of controlling circuitry. Although one or more embodiments as discussed above perform the data handling operations as background operations with respect to a host such as a processor, further embodiments allow for the host to facilitate the various data handling operations in a manner similar to those discussed with respect to controller 170 of FIG. 1. The memory device 700 and the processor 710 form part of an electronic system 720. The memory device 700 has been simplified to focus on features of the memory device that are helpful in understanding the embodiments of the present disclosure.

The memory device 700 includes an array of memory cells 730 that can be arranged in banks of rows and columns. The memory array 730 comprises at least two arrays of memory 732/734 having different densities. Memory array segment 732 may be SLC or MLC (four level) memory and memory array segment 734 may be MLC (eight level) memory, for example. According to one or more embodiments, these memory cells are flash memory cells. Each array 732/734 can consist of multiple banks and blocks of memory cells. The memory cells of the memory array may also be adaptable to store varying densities of data in each cell. For example, some memory cells may be configured to store two bits per cell, at one time and configured to store four bits per cell at a later time. Thus, the determination of density of the different memory array segments for use in the various embodiments may be based on the existing configuration at the time of compaction.

An address buffer circuit 740 is provided to latch address signals provided on address input connections A0-Ax 742. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense/data cache circuitry 750. The sense/data cache circuitry 750, in one embodiment, is coupled to read and latch a row of data from the memory array 730. Data input and output buffer circuitry 760 is included for bi-directional data communication over a plurality of data connections 762 with the processor 710. Write circuitry 755 is provided to write data to the memory array 730.

Control circuitry 770 is configured in part to implement the features of the various embodiments of the present disclosure. In at least one embodiment, the control circuitry 770 may utilize a state machine. According to one or more embodiments, the control circuitry 770, address circuitry 740, I/O circuitry 760, row decode 744, write/erase 755, column decode 746 and the sense/data cache 750 functional blocks may correspond to the controller 170 shown in FIG. 1, for example. Control signals and commands can be sent by the processor 710 to the memory device 700 over the command bus 772. The command bus 772 may be a discrete signal or may be comprised of multiple signals, for example. These command signals 772 are used to control the operations on the memory array 730, including data read, data write (program), and erase operations. The command bus 772, address bus 742 and data bus 762 may all be combined or may be combined in part to form a number of standard interfaces 778. For example, the interface 778 between the memory device 700 and the processor 710 may be a Universal Serial Bus (USB) interface. The interface 778 may also be a standard interface used with many hard disk drives (HDD.) For example, the interface may take the form of an SATA or PATA interface. Other HDD interfaces are known to those skilled in the art.

CONCLUSION

Various embodiments of the present disclosure provide methods for managing memory devices having multiple arrays of memory cells of various densities (e.g., levels.) Also disclosed are apparatus configured to perform data compaction operations wherein the operations are performed that initially write data to an array of lower density memory then compact and move the data to a higher density array of memory in the device at a later time. Additional data handling (e.g., conditioning) has been disclosed that can be performed as part of an operation to move data from the lower density memory to higher density memory thereby improving performance and reliability.

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is manifestly intended that this invention be limited only by the claims and the equivalents thereof.

What is claimed is:

1. A method for managing data stored in a memory device, the method comprising:

reading user data from a first array of memory cells of the memory device having a first density;

performing a data handling operation on the read user data to generate other data, wherein the data handling operation comprises changing a value of the read user data to generate the other data; and writing the other data to a second array of memory cells of the memory device, wherein the second array of memory cells stores the other data in a second density, and wherein the second density is different than the first density;

wherein the value of the user data can be recovered from reading the other data from the second array of memory cells;

wherein changing the value of the read user data to generate the other data comprises adjusting the value of the read user data for program disturb effects such that after the program disturb effects have taken place, the other data written to the second array of memory cells has the value of the read user data.

2. The method of claim 1, wherein reading the user data from the first array of memory cells comprises reading the user data from a first number of memory cells of the first array of memory cells, wherein writing the other data to the second array of memory cells comprises writing the other data to a second number of memory cells of the second array of memory cells, and wherein the first number is greater than the second number.

3. The method of claim 2, further comprising determining the second number, at least in part, upon a desired level of reliability and/or a desired programming speed of the second data.

4. The method of claim 1, wherein the second density different than the first density comprises the second density greater than the first density.

5. The method of claim 1, wherein changing the value of the read user data further comprises performing a block based coding scheme on the read user data.

6. The method of claim 1, wherein reading the user data and writing the other data are performed as background operations of the memory device.

7. The method of claim 1, wherein performing the data handling operation on the read user data to generate the other data further comprises compacting the read user data.

8. The method of claim 1, wherein changing the value of the read user data to generate the other data comprises adding one or more binary digits to the user data, and wherein writing the other data to the second array of memory cells of the memory device comprises writing one or more of the added binary digits to each memory cell of the second array of memory cells receiving the other data.

9. A method for managing data stored in a memory device, the method comprising:

reading user data from a first array of memory cells of the memory device having a first density;

performing a data handling operation on the read user data to generate other data, wherein the data handling operation comprises changing a value of the read user data to generate the other data;

writing the other data to a second array of memory cells of the memory device, wherein the second array of memory cells stores the other data in a second density, and wherein the second density is different than the first density;

reading the other data from the second array of memory cells; and recovering the user data from the read other data;

wherein changing the value of the read user data comprises adjusting the value of the read user data for program disturb effects such that after the program disturb effects have taken place, the other data written to the second array of memory cells has the value of the read user data.

10. The method of claim 9, wherein changing the value of the read user data comprises performing a block based coding scheme on the read user data.

11. The method of claim 10, wherein performing a block based coding scheme on the read user data comprises adding one or more binary digits to a value of a portion of the read user data to be written to a single memory cell of the second array of memory cells as a portion of the other data.

12. The method of claim 9, wherein adjusting the value of the read user data comprises adding one or more binary digits to the value of the read user data.

13. The method of claim 12, wherein adding one or more binary digits to the value of the read user data comprises adding one or more binary digits to a portion of the read user data to be written to a single memory cell of the second array of memory cells as a portion of the other data.

14. The method of claim 9, wherein the data handling operation further comprises redistributing a data pattern of the read user data to generate the other data.

15. The method of claim 14, wherein redistributing the data pattern of the read user data comprises processing the read user data using a pseudo-randomizing function.

16. The method of claim 14, wherein the data handling operation further comprises compacting the read user data to generate the other data.

17. The method of claim 9, wherein changing the value of the read user data to generate the other data comprises adding one or more binary digits to the value of the read user data, and wherein writing the other data to the second array of memory cells of the memory device comprises writing one or more of the added binary digits to each memory cell of the second array of memory cells receiving the other data.

* * * * *